US011189339B1

(12) United States Patent
Liu et al.

(10) Patent No.: US 11,189,339 B1
(45) Date of Patent: Nov. 30, 2021

(54) PERFORMING IN-MEMORY COMPUTING BASED ON MULTIPLY-ACCUMULATE OPERATIONS USING NON-VOLATILE MEMORY ARRAYS

(71) Applicant: MACRONIX INTERNATIONAL CO., LTD., Hsinchu (TW)

(72) Inventors: Yi-Ching Liu, Hsinchu (TW); Chi Lo, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/886,995

(22) Filed: May 29, 2020

(51) Int. Cl.

| | |
|---|---|
| ***G11C 16/10*** | (2006.01) |
| ***G11C 11/4096*** | (2006.01) |
| ***G11C 11/4091*** | (2006.01) |
| ***G11C 11/4094*** | (2006.01) |
| ***G05F 3/26*** | (2006.01) |
| ***G11C 11/4074*** | (2006.01) |
| ***H03M 1/46*** | (2006.01) |
| ***G06F 9/38*** | (2018.01) |
| ***G11C 11/408*** | (2006.01) |
| *G11C 13/00* | (2006.01) |
| *G11C 16/04* | (2006.01) |

(52) U.S. Cl.
CPC .......... *G11C 11/4096* (2013.01); *G05F 3/262* (2013.01); *G06F 9/3893* (2013.01); *G11C 11/4074* (2013.01); *G11C 11/4085* (2013.01); *G11C 11/4091* (2013.01); *G11C 11/4094* (2013.01); *H03M 1/462* (2013.01); *G11C 13/0002* (2013.01); *G11C 13/0004* (2013.01); *G11C 13/0069* (2013.01); *G11C 16/0483* (2013.01)

(58) Field of Classification Search
CPC .............. G06F 9/3893; G11C 13/0069; G11C 13/0004; G11C 13/0002; G11C 16/0483; H03M 1/462
See application file for complete search history.

(56) References Cited

U.S. PATENT DOCUMENTS

| | | | |
|---|---|---|---|
| 6,704,384 B1 * | 3/2004 | Suzuki | G11C 7/222 375/377 |
| 10,528,643 B1 * | 1/2020 | Choi | G06F 17/16 |
| 2019/0102358 A1 * | 4/2019 | Asnaashari | G11C 7/18 |
| 2020/0192971 A1 * | 6/2020 | Lue | G06F 7/5443 |

(Continued)

FOREIGN PATENT DOCUMENTS

| | | |
|---|---|---|
| KR | 20010015332 A | 2/2001 |
| TW | 201822200 A | 6/2018 |

OTHER PUBLICATIONS

TW Office Action dated Jeb. 2, 2021 in Taiwan application (No. 109117967).

*Primary Examiner* — Mushfique Siddique
(74) *Attorney, Agent, or Firm* — McClure, Qualey & Rodack, LLP

(57) ABSTRACT

A memory device includes: a memory array including a plurality of memory cells and a plurality of bit lines; and a current converting circuit, coupled to the memory array. In executing a calculation operation, the memory cells of the memory array generate a source current corresponding to a calculation operation result. The source current is converted by the current converting circuit into an output value for being an input signal provided to a next calculation operation.

10 Claims, 5 Drawing Sheets

(56) References Cited

U.S. PATENT DOCUMENTS

| | | | | |
|---|---|---|---|---|
| 2020/0201751 | A1* | 6/2020 | Wei | G11C 11/4082 |
| 2020/0301667 | A1* | 9/2020 | Hung | G11C 11/5671 |
| 2020/0372330 | A1* | 11/2020 | Chang | G06N 3/0635 |

* cited by examiner

PERFORMING IN-MEMORY COMPUTING BASED ON MULTIPLY-ACCUMULATE OPERATIONS USING NON-VOLATILE MEMORY ARRAYS

TECHNICAL FIELD

The disclosure relates in general to a memory device and an operation method thereof.

BACKGROUND

Big data, AI (Artificial Intelligence) and machine learning have drawn attention. AI operations need a lot of Multiply Accumulate (MAC) operations. Recently, AI hardware needs high performance but low power solution for MAC operations. In-memory computation is widely proposed because the MAC operations are directly executed within the memory array, with much less data movements to save the power and latency.

Thus, how to implement large computation in-memory is important to big data, AI and machine learning fields.

SUMMARY

According to one embodiment, provided is a memory device. The memory device includes: a memory array including a plurality of memory cells and a plurality of bit lines; and a current converting circuit, coupled to the memory array. Wherein, in executing a calculation operation, the memory cells of the memory array generate a source current corresponding to a calculation operation result. The source current is converted by the current converting circuit into an output value for being an input signal provided to a next calculation operation.

According to another embodiment, provided is an operation method for a memory device, the memory device including a memory array, the memory array including a plurality of memory cells and a plurality of bit lines. The operation method includes: generating, by the memory cells of the memory array, a source current corresponding to a calculation operation result in executing a calculation operation; and converting the source current into an output value, the output value for being an input signal provided to a next calculation operation.

Figure 1:
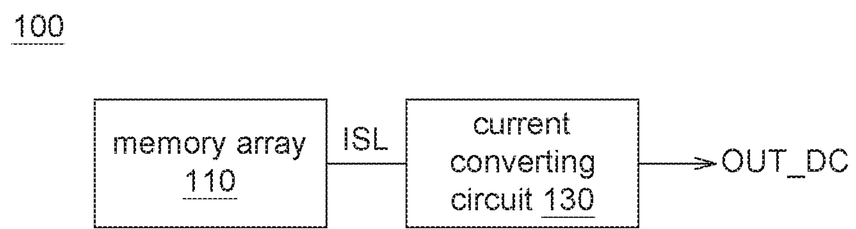
FIG. 1 shows a functional block diagram of a memory device according to one embodiment of the application.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DESCRIPTION OF THE EMBODIMENTS

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, one skilled person in the art would selectively implement part or all technical features of any embodiment of the disclosure or selectively combine part or all technical features of the embodiments of the disclosure.

FIG. 1 shows a functional block diagram of a memory device according to one embodiment of the application. As shown in FIG. 1, the memory device 100 according to one embodiment of the application includes a memory array 110 and a current converting circuit 130.

The memory array 110 is coupled to the current converting circuit 130. In executing MAC (Multiply Accumulate) operations in an AI operations, the memory array 110 generates a source current ISL corresponding to the result of the MAC operation. The source current ISL is converted into an output value OUT_DC by the current converting circuit 130, the output value OUT_DC representing the result of the MAC operation. The output value OUT_DC may be used as an input signal provided to a next calculation operation. For example, a single memory device 100 is used as a single calculation unit, then the output value OUT_DC from the MAC operations performed by the memory device 100 may be input to the next calculation unit (i.e. another memory device 100) for performing next AI operations.

Figure 2:
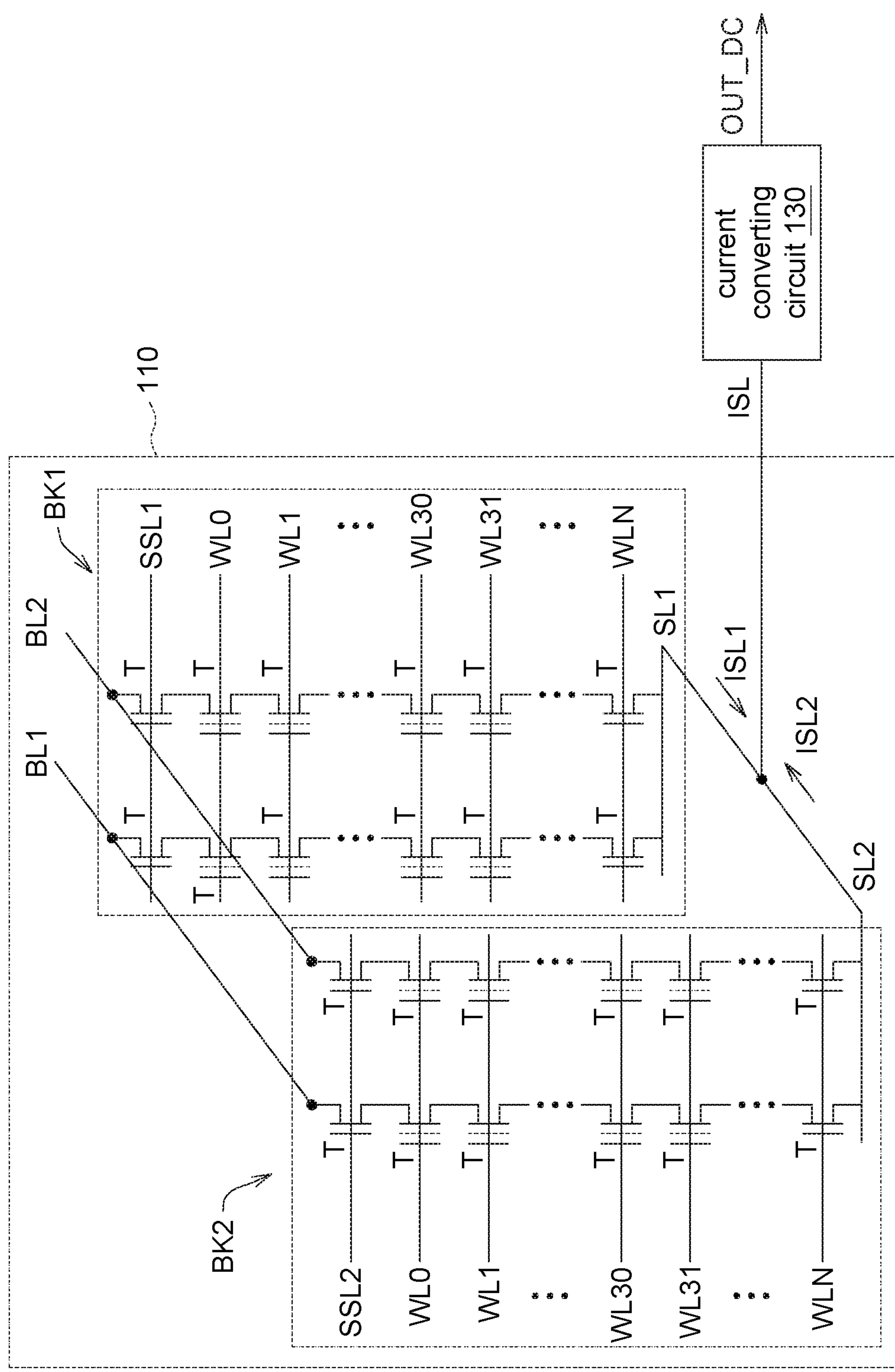
FIG. 2 shows a schematic diagram of source sensing of a memory array according to one embodiment of the application.

FIG. 2 shows a schematic diagram of source sensing of a memory array according to one embodiment of the application. FIG. 2 illustrates the memory array as a 3D (three-dimension) memory array as an example, but the application is not limited by this.

As shown in FIG. 2, the memory array 110 includes a plurality of word lines WL0-WLN (N being a natural number), a plurality of bit lines (BL1-BL2 as an example), a plurality of string select lines (SSL1-SSL2 as an example) a plurality of source lines SL1-SL2 and a plurality of memory cells T. The memory cells T are formed at intersections of the word lines and the bit lines. The memory array 110 includes a plurality of blocks (BK1, BK2, . . . ).

In the following, in executing MAC operations, the bit line voltage is as the input and the cell conductance of the memory cell T coupled to the bit line is as the weight, but the application is not limited by this. The cell current ICELL of the memory cell is the multiplication result of the bit line voltage VBL and the weight of the memory cell (for example but not limited by, the cell conductance GCELL), i.e. ICELL=VBL*GCELL.

When the memory array 110 includes a plurality of memory cells T, the source lines SL1 or SL2 are coupled to the sources of the memory cells T. The respective cell currents of the memory cells T are added via the source lines SL1-SL2 as the source current ISL.

Further, as shown in FIG. 2, the block BK1 includes: at least one memory cell string coupled to the word line W1; and a string select line SSL1. The memory cell string includes a plurality of memory cells T coupled to each other. In MAC operations, the string select lines SSL1 of the block BK1 is turn on. When the word line WL1 is selected, the memory cells T coupled to the selected word line WL1 are also turned on. The weight of the memory cells on the word lines WL1 are W1 and W2, and the bit line voltage VBL1 is on the bit line BL1 while the bit line voltage VBL2 is on the bit line BL2. In MAC operations, the source current ISL1 generated from the memory cells T coupled to the word line WL1 is expressed as below:

$$ISL1=VBL1*W1+VBL2*W2.$$

When the input and the weight are expressed by logic values, logic 1 represents high level while logic 0 represents low level. In the above case, if VBL1=1, VBL2=0, W1=1, W2=1, then ISL1=1*1+0*1=1.

Further, as shown in FIG. 2, the block BK1 includes a plurality of memory cell strings which are coupled to each other and coupled to the corresponding word lines WL1-WLN. In MAC operations, the string select line SSL1 in the block BK1 is selected and conducted. When the word lines WL1-WLn are selected, the memory cells T are turned on. In MAC operations, multiplication of the bit line voltages VBL1-VBL2 and the weights of the memory cells T are added to generate the source current ISL1 of the block BK1. Similarly, the block BK2 includes a plurality of memory cell strings which are coupled to each other and coupled to the corresponding word lines WL1-WLN. In MAC operations, when the string select line SSL2 in the block BK2 is selected and conducted, the source current ISL2 of the block BK2 is generated. The source current ISL from the memory array 110 is ISL=ISL1+ISL2.

Thus, the memory cells are sensed to generate the source current ISL. That is, the source current ISL from the memory array 110 is the sum of the source current generated by the memory cell of several blocks.

Figure 3:
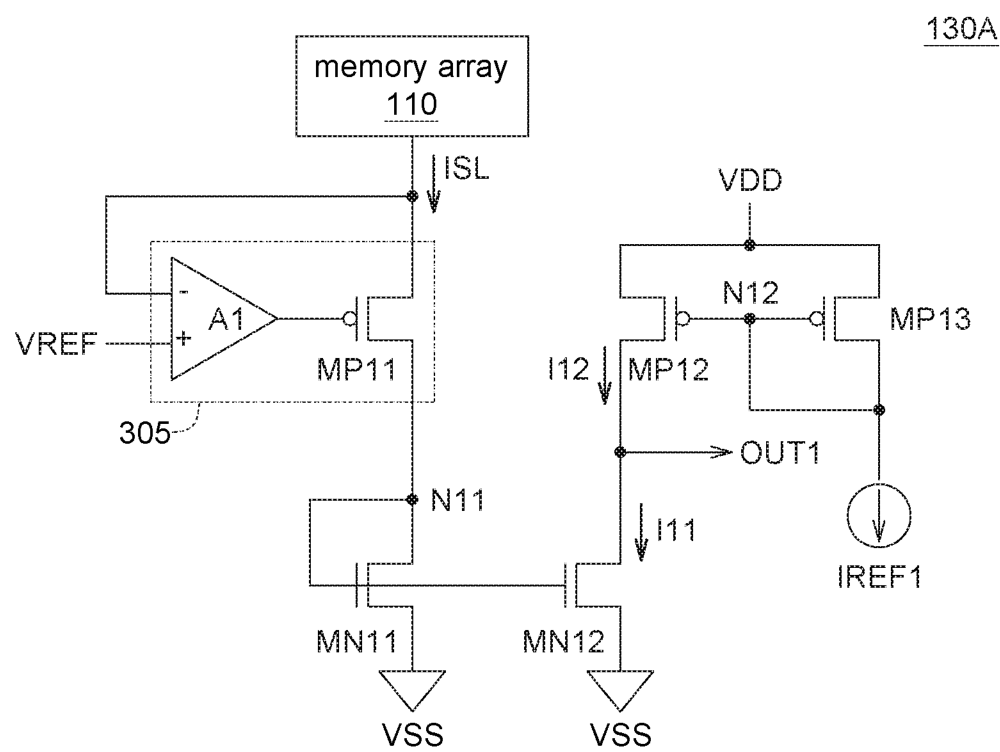
FIG. 3 shows a circuit diagram of a current converting circuit according to one embodiment of the application.

FIG. 3 shows a circuit diagram of a current converting circuit according to one embodiment of the application. The current converting circuit 130A includes: a voltage regulator 305, transistors MP12-MP13 and MN11-MN12 and a reference current source IREF1. The voltage regulator 305 includes an operation amplifier A1 and a transistor MP11.

Two input terminals of the operation amplifier A1 are coupled to a reference voltage VREF and the source of the transistor MP11, respectively. The output of the operation amplifier A1 is coupled to the gate of the transistor MP11. The operation amplifier A1 and the transistor MP11 are used to provide a stable voltage. In details, via the negative feedback of the operation amplifier A1, the source voltage of the transistor MP11 is close to the reference voltage VREF. When the transistor MP11 is turned on, the drain voltage of the transistor MP11 is close to the reference voltage VREF. Thus, the node voltage of the node N11 is close to the reference voltage VREF, which can stabilize the source current ISL.

The transistor MP11 includes a source receiving the source current ISL; a gate coupled to the output of the operation amplifier A1; and a drain coupled to the node N11.

The transistor MN11 includes a source and a gate both coupled to the node N11; and a drain coupled to a reference voltage VSS. The reference voltage VSS may be a ground voltage.

The transistor MN12 includes a source coupled to an output OUT1; a gate coupled to the gate of the transistor MN11 and a drain coupled to the reference voltage VSS. The transistors MN11 and MN12 form a first current mirror to mirror the source current ISL for producing the current I11.

The transistor MP12 includes a source receiving the operation voltage VDD; a gate coupled to the gate of the transistor MP13 (i.e. coupled to the node N12) and a drain coupled to the output OUT1.

The transistor MP13 includes a source receiving the operation voltage VDD; a gate coupled to the gate of the transistor MP12 (i.e. coupled to the node N12) and the reference current source IREF1; and a drain coupled to the reference current source IREF1.

The transistors MP12 and MP13 form a second current mirror to mirror the reference current IREF1 to generate the current I12.

Operations of the current converting circuit 130A are as follows.

Via the transistor MP11 and the operation amplifier A1, the node voltage of the node N11 can be made approximately equal to the reference voltage VREF. Via the first current mirror formed by the transistors MN11 and MN12, a current I11 is generated on the current path of the transistor MN12, wherein I11=ISL.

Similarly, via the second current mirror formed by the transistors MP12 and MP13, a current I12 is generated on the current path of the transistor MP12, wherein I12=IREF1.

The voltage level of the output OUT1 is decided by the pull up strength of the transistor MP12 and the pull down strength of the transistor MN12. Thus, if the current I11 (=ISL) is larger than the current I12(=IREF1), then the output OUT1 is at high level (for example but not limited by logic 1); and vice versa, if the current I11(=ISL) is smaller than the current I12(=IREF1), then the output OUT1 is at low level (for example but not limited by logic 0). In one embodiment of the application, the reference current IREF1 may be adjusted if needed. For example, in one example, the reference current IREF1 may be set as M; while in another example, the reference current IREF1 may be set as 2*M.

Thus, via the current converting circuit 130A of FIG. 3, the MAC operation result OUT1 is generated, wherein OUT1 is the output value OUT_DC.

Figure 4:
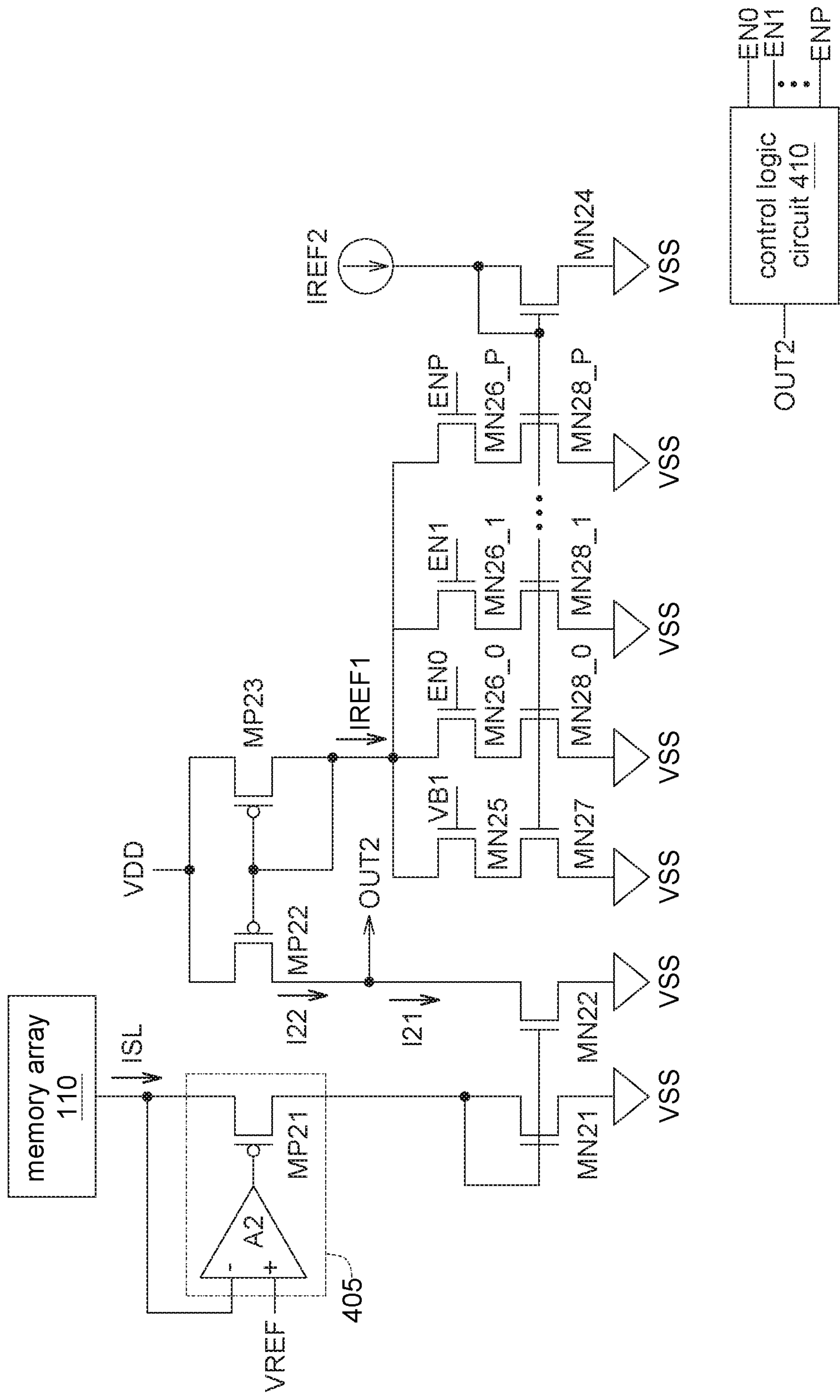
FIG. 4 shows a circuit diagram of a current converting circuit according to another one embodiment of the application.

FIG. 4 shows a circuit diagram of a current converting circuit according to another one embodiment of the application. The current converting circuit 130B includes a voltage regulator 405, transistors MP22-MP23 and MN21-MN28_P, a reference current source IREF2 and a control logic circuit 410. The voltage regulator 405 includes an operation amplifier A2 and a transistor MP21.

Operations of the operation amplifier A2, the transistors MP21-MP23, MN21 and MN22 may be the same or similar to that of the operation amplifier A1, the transistors MP11-MP13, MN11 and MN12 of FIG. 3 and thus are omitted.

In one embodiment of the application, the control logic circuit 410 is for example but not limited by, an SAR (Successive Approximation Register) logic circuit. The control logic circuit 410 outputs enable signals (or control signals) EN0-ENP to the transistors MN26_0-MN26_P, respectively. The transistors MN25 and MN26_0-MN26_P act as the switching transistors (also referred as a switch transistor group) to control the value of the reference current IREF1, wherein I22=IREF1. The gate of the transistor MN25 receives the bias voltage VB1. The bias voltage VB1 turns on the transistor MN25 in a normal state. The enable signals EN0-ENP control the transistors MN26_0-MN26_P as turned on or turned off, respectively. In accordance with the currents I22 and I21 (i.e. the source current ISL, I21=ISL), the control logic circuit 410 iteratively generates the enable signals EN0-ENP, wherein the enable signals EN0-ENP control the switch transistor group to control the value of the reference current IREF1.

The reference current source IREF2 flows through the transistor MN24. The transistors MN24, MN27 and MN28_0-MN28_P form a plurality of current mirrors (also referred as a current mirror group). For example, if the width-length ratio of the transistor MN24 is set as 1, then the width-length ratio of the transistor MN27 is set as 0.5, and the width-length ratios of the transistors MN28_0-MN28_PMN24 are set as $2^0, 2^1, \ldots, 2^P$, respectively. That is, the current flowing through the transistor MN27 is 0.5*IREF2; the current flowing through the transistor MN28_0 is $2^0$ *IREF2 (if the transistor MN26_0 is turned on); the current flowing through the transistor MN28_1 is $2^1$*IREF2 (if the transistor MN26_1 is conducted), and so on.

Operations of the current converting circuit 130B are as follows.

Via the operation amplifier A2, the transistors MP21, MN21 and MN22, a current I21 is outputted on the current path of the MN22, wherein I21=ISL. The third current mirror formed by the transistors MN21 and MN22 mirrors the source current ISL to generate the current I21.

Similarly, via the current mirror formed by the transistors MP22 and MP23, a current I22 is outputted on the current path of the MP22, wherein the current I22 is the sum of the currents output from the transistors MN27 and MN28_0-MN28_P. The fourth current mirror formed by the transistors MP22 and MP23 mirrors the reference current IREF1 to generate the current I22.

If the current I21(=ISL) is larger than the current I22, then the output OUT2 is at high level (for example but not limited by logic 1); and if the current I21 is smaller than the current I22, then the output OUT2 is at low level (for example but not limited by logic 0).

Via iteratively controlling the enable signals EN0-ENP, the control logic circuit 410 can make the current I22 gradually approach the source current ISL. When the current I22 is closest to the source current ISL, the control logic circuit 410 outputs the enable signals EN0-ENP.

Thus, the current converting circuit 130B of FIG. 4 generates the reference current IREF1 on the current path of the transistor MP23. The transistor MN24, the reference current source IREF2, the control logic circuit 410, the transistor MN25, the transistors MN26_0-MN26_P, the transistor MN27, the transistors MN28_0-MN28_P are used to generate the reference current IREF1 of FIG. 3.

Figure 5:
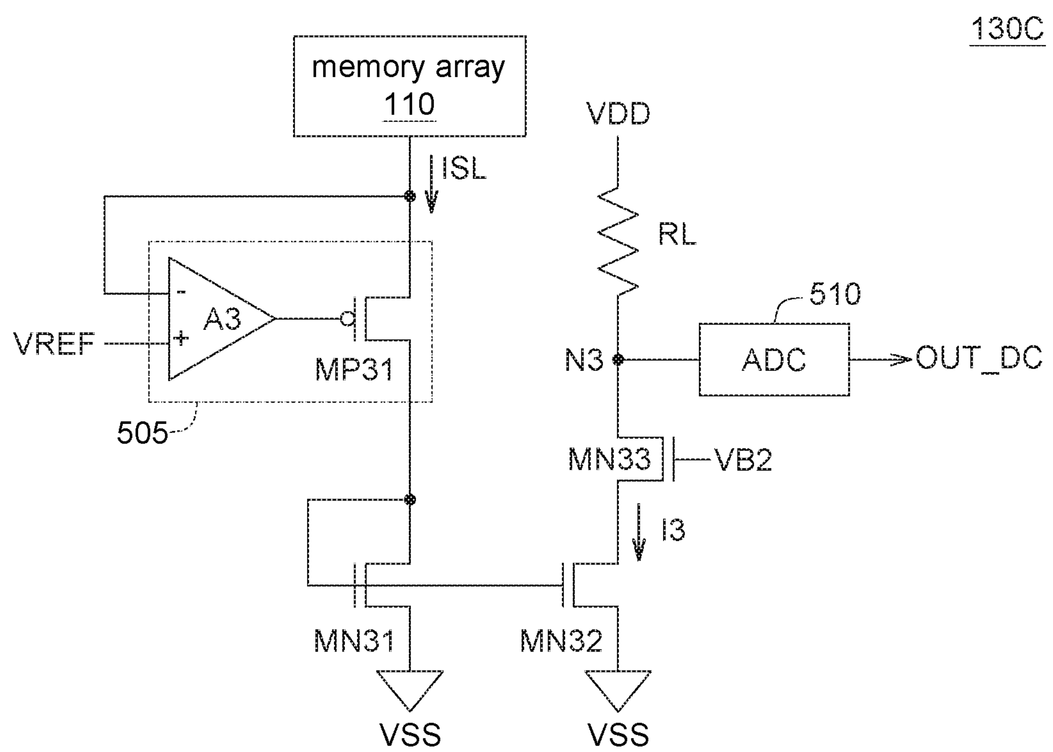
FIG. 5 shows a circuit diagram of a current converting circuit according to yet another embodiment of the application.

FIG. 5 shows a circuit diagram of a current converting circuit according to yet another embodiment of the application. The current converting circuit 130C includes a voltage regulator 505, transistors MN31-MN33, a resistor RL and an analog-to-digital converter (ADC) 510. The voltage regulator 505 includes an operation amplifier A3 and a transistor MP31. The current converting circuit 130C of FIG. 5 outputs an MAC operation result OUT_DC having Q-bit resolution (Q being a natural number, and Q being the resolution of the ADC 510).

The operations of the operation amplifier A3 and the transistors MP31 and MN31-MN32 are the same or similar to that of the operation amplifier A1 and the transistors MP11 and MN11-MN12 of FIG. 3; and thus the details thereof are omitted here.

The transistor MN33 includes a source coupled to the resistor RL; a gate receiving the bias voltage VB2 and a drain coupled to the drain of the transistor MN32. The bias voltage VB2 turns on the transistor MN33 in a normal state.

Operations of the current converting circuit 130C are as follows.

Via the operation amplifier A3 and the transistor MP31, MN31 and MN32, a current I3 is generated on the current path of the transistor MN32, wherein I3=ISL. The fifth current mirror formed by the transistor MN31 and MN32 mirrors the source current ISL to generate the current I3.

The current I3 also flows through the resistor RL, and the node voltage of the node N3 is VDD−RL*I3. The node voltage of the node N3 is received by the ADC 510. The node voltage of the node N3 is related to the current value of the source current ISL. The ADC 510 converts the node voltage of the node N3 into the MAC operation result OUT_DC.

Embodiments of the application execute MAC operation via source side sensing. The memory cell current represents the multiplication of the input (for example but not limited by the bit line voltage) and the weight (for example but not limited by the cell conductance). The sources of the memory cells are coupled to the common node; and the source currents of the cells are summed to execute the MAC operations. The MAC operation results may be input into other MAC operation stages or input into a controller (not shown) for specific information or specific pattern identification, which may be used in AI, big data, machine learning fields.

In embodiments of the application, the memory device is for example 3D NAND flash memory device but the application is not limited by this. The application is also applied to other types of memory devices, which is still within the spirit and scope of the application.

In the above example, the bit line voltage is as the input, the cell conductance is as the weight; and the memory cell current is the multiplication result obtained by multiplying the input and the weight. The application is not limited by this. In other possible embodiment of the application, any parameter combinations which control the cell current may be used as the input or the weight. For example, the word line voltage may be used as the input; and the threshold voltage of the memory cell may be used as the weight. These are still within the spirit and the scope of the application.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory device including:

a memory array including a plurality of memory cells and a plurality of bit lines; and a current converting circuit, coupled to the memory array, wherein the current converting circuit includes:

a first reference current source for generating a first reference current, a voltage regulator coupled to the memory array for receiving the source current;

a second reference current source for generating a second reference current;

a first current mirror, coupled to the voltage regulator for mirroring the source current into a first current;

a second current mirror, coupled to the first current mirror and the first reference current source, for mirroring the first reference current into a second current;

a switch transistor group coupled to the second current mirror; and a current mirror group, coupled to the switch transistor group and the second reference current source, for mirroring the second reference current into the second current, wherein the current mirror group is different from the first current mirror and the second current mirror;

wherein in executing a calculation operation, the memory cells of the memory array generate a source current corresponding to a calculation operation result; and an output value of the current converting circuit is determined based on the source current and the first reference current, and the output value is configured to be an input signal provided to a next calculation operation, the switch transistor group determines the second current.

2. The memory device according to claim 1, wherein the current converting circuit further includes a control logic circuit coupled to the switch transistor group, the control logic circuit iteratively generates a plurality of enable signals in accordance with the second current and the source current, and the enable signals being used for controlling the switch transistor group.

3. The memory device according to claim 2, wherein the control logic circuit is an SAR (Successive Approximation Register) logic circuit.

4. The memory device according to claim 1, wherein the source current is a multiply accumulate of a plurality of weights and a plurality of inputs.

5. The memory device according to claim 4, wherein the weight includes a conductance of the memory cell or a threshold voltage of the memory cell, and the input includes a bit line voltage or a word line voltage.

6. An operation method for a memory device, the memory device including a memory array, the memory array including a plurality of memory cells and a plurality of bit lines, the operation method including:

generating, by the memory cells of the memory array, a source current corresponding to a calculation operation result in executing a calculation operation;

receiving the source current;

mirroring the source current into a first current generating a first reference current;

mirroring the first reference current into a second current;

generating a second reference current;

mirroring the second reference current into the second current; and converting the source current into an output value, the output value for being an input signal provided to a next calculation operation;

wherein the output value is determined based on the source current and the first reference current, the second current is further determined by a switch transistor group.

7. The operation method according to claim 6, wherein a plurality of enable signals are iteratively generated in accordance with the second current and the source current, and the enable signals control the switch transistor group.

8. The operation method according to claim 7, wherein the control logic circuit is an SAR (Successive Approximation Register) logic circuit.

9. The operation method according to claim 6, wherein the source current is a multiply accumulate of a plurality of weights and a plurality of inputs.

10. The operation method according to claim 9, wherein the weight includes a conductance of the memory cell or a threshold voltage of the memory cell, and the input includes a bit line voltage or a word line voltage.

* * * * *